United States Patent
King et al.

(10) Patent No.: US 9,954,128 B2
(45) Date of Patent: Apr. 24, 2018

(54) STRUCTURES FOR INCREASED CURRENT GENERATION AND COLLECTION IN SOLAR CELLS WITH LOW ABSORPTANCE AND/OR LOW DIFFUSION LENGTH

(71) Applicant: The Boeing Company, Chicago, IL (US)

(72) Inventors: Richard R. King, Thousand Oaks, CA (US); Moran Haddad, Granada Hills, CA (US); Philip T. Chiu, La Crescenta, CA (US); Xingquan Liu, La Crescenta, CA (US); Christopher M. Fetzer, Valencia, CA (US)

(73) Assignee: THE BOEING COMPANY, Chicago, IL (US)

( * ) Notice: Subject to any disclaimer, the term of this patent is extended or adjusted under 35 U.S.C. 154(b) by 67 days.

(21) Appl. No.: 14/993,800

(22) Filed: Jan. 12, 2016

(65) Prior Publication Data
US 2017/0200845 A1    Jul. 13, 2017

(51) Int. Cl.
*H01L 31/044* (2014.01)
*H01L 31/056* (2014.01)
*H01L 31/0687* (2012.01)
*H01L 31/0304* (2006.01)

(52) U.S. Cl.
CPC ...... *H01L 31/056* (2014.12); *H01L 31/03042* (2013.01); *H01L 31/03048* (2013.01); *H01L 31/0687* (2013.01)

(58) Field of Classification Search
CPC ........ H01L 31/00–31/078; Y02E 10/50–10/60
USPC .................................................. 136/243–265
See application file for complete search history.

(56) References Cited

U.S. PATENT DOCUMENTS

| | | |
|---|---|---|
| 8,637,759 B2 | 1/2014 | Foster et al. |
| 2007/0012238 A1 | 1/2007 | Kretzer et al. |
| 2008/0128014 A1 | 6/2008 | Van Riesen et al. |
| 2008/0128023 A1* | 6/2008 | Arianpour ......... H01L 31/02168 136/261 |
| 2010/0229926 A1 | 9/2010 | Newman et al. |
| 2010/0319764 A1 | 12/2010 | Wiemer et al. |
| 2012/0103403 A1 | 5/2012 | Misra et al. |

(Continued)

OTHER PUBLICATIONS

Author Unknown, "Single Junction Solar Cells", Photovoltaics Lab IOFFE, Copyright 2013, http://pvlab.ioffe.ru/about/solar_cells.html, accessed Jan. 12, 2016, pp. 1-5.

*Primary Examiner* — Bach T Dinh
(74) *Attorney, Agent, or Firm* — MH2 Technology Law Group LLP

(57) ABSTRACT

The present disclosure generally relates to a solar cell device that a first Bragg reflector disposed below a first solar cell and a second Bragg reflector disposed below the first Bragg reflector, wherein the first solar cell comprises a dilute nitride composition and has a first bandgap, wherein the first Bragg reflector is operable to reflect a first range of radiation wavelengths back into the first solar cell and the second Bragg reflector is operable to reflect a third range of wavelengths back into the first solar cell, and the first Bragg reflector and the second Bragg reflector are operable to cool the solar cell device by reflecting a second range of radiation wavelengths that are outside the photogeneration wavelength range of the first solar cell or that are weakly absorbed by the first solar cell.

20 Claims, 11 Drawing Sheets

(56) References Cited

U.S. PATENT DOCUMENTS

2015/0021803 A1\* 1/2015 Shiode ................. G03F 7/0002
                                                       264/40.5
2017/0054048 A1   2/2017 Derkacs
2017/0117437 A1\* 4/2017 Shur ....................... H01L 33/06

\* cited by examiner

STRUCTURES FOR INCREASED CURRENT GENERATION AND COLLECTION IN SOLAR CELLS WITH LOW ABSORPTANCE AND/OR LOW DIFFUSION LENGTH

GOVERNMENT INTEREST

This invention was made with U.S. Government support under Contract No. FA9453-14-C-0372 awarded by the Air Force Research Labs. The U.S. Government has certain rights in the invention.

FIELD OF THE INVENTION

This disclosure relates generally to solar cells, and more particularly to structures for increased current generation and collection in solar cells with low absorptance and/or low diffusion length.

BACKGROUND

Because of their high efficiency, conventional multijunction solar cells have been widely used for terrestrial and space applications. Multijunction solar cells include multiple diodes in series connection, known in the art as "junctions," realized by growing thin regions of epitaxy in stacks on semiconductor substrates. Each junction in a stack is optimized for absorbing a different portion of the solar spectrum, thereby improving efficiency of solar energy conversion.

Conventional multijunction solar cells have features that reduce the efficiency of solar to electrical energy conversion. For example, a portion of solar energy incident on the front side of a solar cell cannot be absorbed due to metallic electrodes blocking a portion of the side facing the sun. Furthermore, a portion of the absorbed solar energy cannot be collected at the electrodes as electrical power because the energy is dissipated as heat (for example, as resistive loss) during lateral conduction in the emitter region of the top junction and in the metallic gridlines. For high-power devices, such as concentrated photovoltaic devices or large area solar cells, the dissipated heat may also result in substantially increased temperature, thereby further reducing the performance of the device. Typically there is a trade-off between these parameters and others. Multijunction solar cells are typically designed to give the optimum solar to electrical energy conversion performance under desired conditions. It is desirable to improve efficiency in multijunction solar cell devices.

Previous solar cells with weak-current-producing layers suffer from low current and low efficiency. When incorporated in a multijunction cell, the low current production of one of these subcells may limit the current of the entire series-connected multijunction solar cell stack. With the low-current solar cell/reflector structures in the various aspects of the present disclosure, significantly higher currents can be achieved in solar cells with low absorption coefficient or low minority-carrier collection probability, resulting in higher efficiency, more cost effective photovoltaic cells.

SUMMARY

According to various examples, a solar cell device is disclosed that can comprise a substrate comprising a front side surface and a backside surface; an epitaxial region overlying the substrate, wherein the epitaxial region comprises a first Bragg reflector disposed below a first solar cell and a second Bragg reflector disposed below the first Bragg reflector, wherein the first solar cell comprises a dilute nitride composition and has a first bandgap, wherein the first Bragg reflector is operable to reflect a first range of radiation wavelengths back into the first solar cell and the second Bragg reflector operable to reflect a third range of wavelengths back into the first solar cell, and the first Bragg reflector and the second Bragg reflector are operable to cool the solar cell device by reflecting a second range of radiation wavelengths that are outside the photogeneration wavelength range of the first solar cell or that are weakly absorbed (<50% absorptance) by the first solar cell; a capping layer disposed above the top surface of the first solar cell; a first metal contact disposed below the backside surface; and a second metal contact disposed below the top surface of the capping layer.

According to various examples, a solar cell device is disclosed that can comprise a substrate; a first solar cell; and an epitaxial region overlying the substrate, wherein the epitaxial region comprises a first Bragg reflector disposed below a first solar cell and a second Bragg reflector disposed below the first Bragg reflector, wherein the first solar cell comprises a dilute nitride composition and has a first bandgap, wherein the first Bragg reflector is operable to reflect a first range of radiation wavelengths back into the first solar cell and the second Bragg reflector operable to reflect a third range of wavelengths back into the first solar cell, the first Bragg reflector and the second Bragg reflector operable to cool the solar cell device by reflecting a second range of radiation wavelengths outside of the solar cell device.

Various optional features of the above examples include the following. The first solar cell comprises GaInNAs or GaInNAsSb. The solar cell device can further comprise a second solar cell disposed above the top surface of the first solar cell, wherein the second solar cell has a bandgap that is higher than the bandgap of the first solar cell. The first Bragg reflector can comprise a tunnel junction formed between a p-type layer and a n-type layer of the first Bragg reflector. The tunnel junction can comprise a carbon doped AlGaAs p-side layer and a tellurium doped GaAs n-type layer. The tunnel junction can be about 400 Å in thickness. The first Bragg reflector can comprise a layer composed of a material that has been doped by one or more n-type materials. The AlGaAs has an aluminum mole fraction of 60% to 90%. The tunnel junction p-type and n-type layers have thicknesses between 100 Å and 1000 Å. The first Bragg reflector comprises a layer composed of a material that has been doped by two or more n-type dopants. The two different n-type dopants comprise tellurium and silicon. The first Bragg reflector comprises a back-surface field (BSF) layer of an adjacent solar cell. The first Bragg reflector comprises an emitter layer, a window layer, or a front-surface-field (FSF) layer of an adjacent solar cell.

According to various examples, a solar cell device is provided that comprises a substrate; a first solar cell; and an epitaxial region overlying the substrate, wherein the epitaxial region comprises a first Bragg reflector disposed below a first solar cell and a second Bragg reflector disposed below the first Bragg reflector, wherein the first solar cell comprises a dilute nitride composition and has a first bandgap, wherein the first Bragg reflector is operable to reflect a first range of radiation wavelengths back into the first solar cell and the second Bragg reflector is operable to reflect a third range of wavelengths back into the first solar cell, and the first Bragg reflector and the second Bragg reflector are operable to cool the solar cell device by reflecting a second range of radiation wavelengths that are outside the photo-generation wavelength range of the first solar cell or that are weakly absorbed (<50% absorptance) by the first solar cell; wherein the first Bragg reflector and the second Bragg reflector comprise one or more solar cell structures of an adjacent solar cell, chosen from a list including: a p-type tunnel junction layer; an n-type tunnel junction layer; a back-surface field (BSF) layer; an emitter layer; a window layer; a front-surface-field (FSF) layer; or an electrical contact layer.

Various optional features of the above examples include the following. The first solar cell comprises GaInNAs or GaInNAsSb. The solar cell device can further comprise a second solar cell disposed above the top surface of the first solar cell, wherein the second solar cell has a bandgap that is higher than the bandgap of the first solar cell. The first Bragg reflector comprises a tunnel junction formed between a p-type layer and an n-type layer of the first Bragg reflector. The tunnel junction comprises a carbon doped AlGaAs p-side layer and a tellurium doped GaAs n-type layer. The AlGaAs has an aluminum mole fraction of 60% to 90%. The tunnel junction p-type and n-type layers have thicknesses between 100 Å and 1000 Å. The first Bragg reflector comprises a layer composed of a material that has been doped by two or more n-type dopants. The two different n-type dopants comprise tellurium and silicon.

BRIEF DESCRIPTION OF THE DRAWINGS

Various features of the examples can be more fully appreciated, as the examples become better understood with reference to the following detailed description, when considered in connection with the accompanying figures, in which.

DETAILED DESCRIPTION

Figure 1:
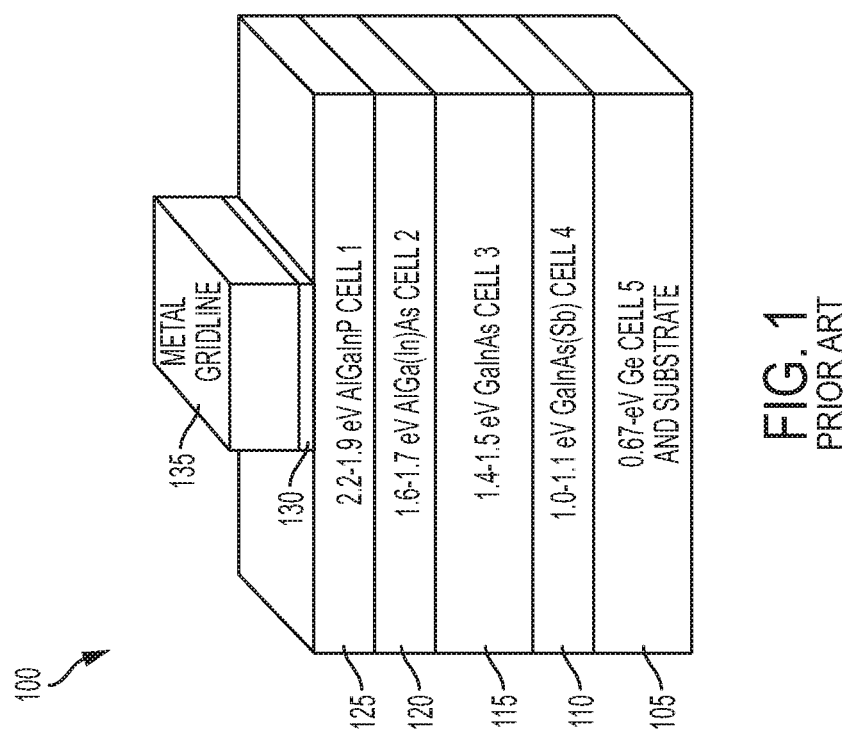
FIG. 1 depicts an example schematic cross section of a conventional 5-junction nitride cell (having a dilute nitride GaInNAs(Sb) subcell), with no Bragg reflector beneath the nitride cell 4.

Reference will now be made in detail to the present examples (exemplary examples) of the disclosure, examples of which are illustrated in the accompanying drawings. Wherever possible, the same reference numbers will be used throughout the drawings to refer to the same or like parts. In the following description, reference is made to the accompanying drawings that form a part thereof, and in which is shown by way of illustration specific exemplary examples in which the disclosure may be practiced. These examples are described in sufficient detail to enable those skilled in the art to practice the disclosure and it is to be understood that other examples may be utilized and that changes may be made without departing from the scope of the disclosure. The following description is, therefore, merely exemplary.

Conventional solar cells operate by absorbing radiation and converting that radiation into electricity through the photovoltaic effect. Solar cells typically are not able to use all the radiation they receive and, as a result, the radiation turns into heat causing the solar cells to rise in temperature, and thus, lower its efficiency. Moreover, some solar cells comprise the addition of a nitride layer, which typically is a poor choose for solar cells due to its short diffusion length, but has the benefits of providing optimal bandgap properties, around 1.0-1.2 eV, for absorbing longer wavelengths and providing a lattice matching arrangement with the substrate and the layers above the nitride layer. However, the nitride layer typically needs to be thinly grown so that the current produced in the nitride layer is not lost; however, the thinner the nitride layer is grown, the poorer the nitride layer becomes in collecting radiation.

In accordance with aspects of the present teachings, the epitaxial formation of one or more distributed Bragg reflector structures (or simply "Bragg reflector" "Bragg reflector structure") within the solar cell, and below the nitride layer (discussed further below), allow the longer wavelength incident onto the solar cell to reflect back into the weakly absorbing dilute nitride layer, while also allowing a portion of the incident radiation to be reflected out of the solar cell to effectively cool the solar cell. Each Bragg reflector structure is operable to reflect a range of wavelengths due, in part, on the particular structure (i.e., number of layers, composition of layers, etc). The addition of a second Bragg reflector below a first Bragg reflector increases the wavelength range of radiation that can be reflected. The second Bragg reflector, below the first, can reflect a range of longer wavelengths than the first due to its position further down in the solar cell stack.

Generally speaking, aspects of the present disclosure relate to dilute nitride solar cells—or other types of solar cells with photogeneration layers that are weak current producing layers, due to being thin layers, having a relatively high bandgap, having a short-minority carrier diffusion length, or combinations of these features—having reflective or light scattering structures incorporated into the cell or surrounding layers that increase the path length of light through the weak current producing layers, thereby increasing light absorption, photogeneration of carriers, and collection of carriers as useful current.

In some examples of the present teachings, a single or multijunction solar cell is provided that can comprise one or more dilute nitride solar cells, such as GaInNAs or GaInNAsSb, and can comprise one or more Bragg reflector structures beneath the nitride cell, to reflect light twice through the relatively narrow region of the cell with high minority-carrier collection probability, including the space-charge region of the dilute nitride solar cell, thereby increasing photogeneration of carriers in the high collection probability region, and increasing current collection in the solar cell. In some examples of the present teachings, one or more weak-current-producing solar cells can have a semiconductor Bragg reflector grown beneath the cell, such as an AlGaAs/GaAs, AlGaAs/GaInAs, AlGaInAs/GaAs, or AlGaInAs/GaInAs Bragg reflector integrated into the cell to increase photogeneration and current of the cell. One or more semiconductor Bragg reflectors can be grown beneath the cell, in optical series, positioned with one Bragg above another, and with layer thicknesses tuned to give the two or more Bragg reflectors different reflectance wavelength ranges, in order to reflect a broader wavelength range back through the nitride cell for a second pass, and increase current density of the nitride cell.

In space the main source of a body obtaining thermal equilibrium is through radiant absorption and emission of photons. This process is very well understood by the principles of black-body radiation and the Stefan-Boltzmann equations taught in basic thermodynamics texts. See Henninger, J. H., *Solar Absorptance and Thermal Emittance Data of Some Common Spacecraft Thermal-Control Coatings*, NASA, NASA Reference Publications, 1984. p. 1-3 "Henninger". In the case of any general body (satellite, solar cell, etc.) where the only path to obtain thermal equilibrium is via this photon emission and absorption, then the equation governing this state is simply put:

$$J_{abs} = J_{emit} \quad [1]$$

where $J_{abs}$ and $J_{emit}$ are the thermal current or power absorbed and emitted, respectively. Equation 1 is a simple statement that all the power from photons emitted by a body must equal the power absorbed. There are no other sources of thermal energy and the body is not changing temperature.

Equation 1 can be extended for something useful for the various aspects of the present disclosure by knowing that all the power absorbed ($J_{abs}$) is related to the total power of the sun (s ~1.36 kW/m²) in space at the earth's mean distance from the sun, the area absorbing light, $A_e$, and the absorptance, α, (α is also known as the solar abosprtance). Similarly, the emitted power ($J_{emit}$) is related to the black-body emission of Stefan-Boltzmann Law:

$$J_{emit} = A\sigma\epsilon T^4 \quad [2]$$

where A is the total area of the body emitting light, s is the Stefan-Boltzmann constant ($\sigma = 5.67 \times 10^{-8}$ W/m²K⁴), ε is the emittance, and T is the temperature (in Kelvin). Equation 2 can be leverage the equation to calculate the temperature of a body in this case.

$$T = \left[\frac{A_e}{A} \cdot \frac{s}{\sigma} \cdot \frac{\alpha}{\epsilon}\right]^{1/4} \quad [3]$$

As can be seen in Equation 3, the temperature of a body is a function of constants and area. In particular, the constants of absorptance and emittance can be engineered quantities within the solar cell to manage the temperature of the device. In most terrestrial devices or panels this configuration is fixed.

The emittance is a property of the materials used within the device and the final outer layer of the solar cell structure and solar array wing or panel. Since the ability to alter those structures is typically limited, the focus is on the absorptance. From Equation 3, it can be seen that reducing the solar absorptance within the solar cell will reduce the structure temperature to the $\frac{1}{4}^{th}$ power.

Reducing the temperature is important to the operation of a solar cell. Well known in solar cell device physics is the effect of temperature on the power conversion efficiency of the device. For all solar materials and p-n junction solar cells, increasing temperature will result in a decrease in the voltage of the device. Concomitantly, the bandgap of the device, which increases the absorbed photon current. The product of the voltage and current of the device is the power. Unfortunately, the voltage decreases faster than the current increases and the net effect is that the device loses power with increasing temperature. See Sze, S. M., *Physics of Semiconductor Devices*, 2$^{nd}$ Ed., Wiley, N.Y., p. 808. This fact is characterized by a negative temperature coefficient for power (dP/dT) as well understood by those skilled in the art.

The solar absorptance, α, is related directly to the solar reflectance of the solar cell ρ, equation 3 & 4 in Henninger.

$$\alpha = 1 - \rho \quad [5]$$

where r is an integrated spectrum of the solar cell reflectance R(λ) against the incident spectrum H(λ) over all wavelengths, λ, and all emittance angles, θ. In Henninger, the measurement is taken over practical limitations of 0.3 to 2.4 µm. Current practice is to integrate from 0.25 to 2.5 µm as this subtends the vast majority of the solar spectrum irradiance.

The practical importance of equations 4 & 5 is that by increasing the solar reflectance, ρ, one may decrease the operational temperature of the cell, T.

In view of the above, aspects consistent with the present teaches use a distributed Bragg reflector (DBR) to reflect unused photons from the lowest subcell. The DBR structure can be applied to capture photons inside a subcell that would have passed through that device. Thereby, one may engineer a structure that captures more light for a reduced thickness. This configuration has the advantage of enabling less material and hence lower cost. And in other application, utilizing DBRs in this configuration in a solar cells operating in space reduces the impact of space based particle radiation damage, which scales with thickness of the solar cell or subcell.

Following the preceding discussion, one may contemplate a device structure which increases reflection in an optimal method. Previous efforts known to the authors include the use of reflective coatings on the front surface of the final glass surface (top surface) to reject photons before entering the device. Alternatively, highly reflective metal layers above or below the solar cell may act as a mirror to reflect broadband, long wavelength, typically near to mid infrared wavelengths, light not utilized within the cell. Both of these configurations are well understood by those skilled in the art.

Presently, a solar cell with a DBF having a combined purpose to reflect unused or excess photons from within the cell structure to increase the solar reflectance, and hence reduce the cell operating temperature is provided. In using a DBR below or between subcells of a multijunction solar cell, the DBR can be operable to reflect excess light away from subcells with available excess absorption, without re-capturing the light for the purpose of thinning the material usage or increasing radiation hardness as previously described. This application of a DBR may be used in combination with other DBR(s) utilized to affect the aforementioned purposes. In short, multiple DBRs may be employed within the same device. Additionally, multiple DBRs can be used to effect a larger bandwidth of reflected light or by reflecting specific regions of solar spectrum for another purpose such as collection by another type of device like a thermal absorber. Hence, the photovoltaic device is cooled while providing power to a solar thermal collection device providing a beneficial relationship between the two devices for a increased power conversion efficiency.

FIG. 1 depicts a simplified schematic cross sectional view of a conventional 5-junction nitride solar cell 100 (having a dilute nitride GaInNAs(Sb) subcell), with no Bragg reflector beneath the nitride cell 4 110. The conventional 5-junction nitride solar cell 100 shown in FIG. 1 comprises five sub-cells (junctions) 105, 110, 115, 120, 125 that are connected through tunnel junctions (not shown). Each sub cell of solar cell 100 is composed of a different material having a different bandgap, with materials having a larger bandgap formed on top and materials having a smaller bandgap from at the bottom of the solar cell 100. As shown in the example of FIG. 1, the sub-cells comprise (from the top where the light is incident) sub-cell 1 125 composed of AlGaInP having a bandgap of about 2.2-1.9 eV, sub-cell 2 120 composed of AlGa(In)As having a bandgap of about 1.6-1.7 eV, sub-cell 3 115 composed of GaInAs having a bandgap of about 1.4-1.5 eV, and sub-cell 4 110 composed of GaInNAs (Sb) having a bandgap of about 1.0-1.1 eV. All the above-noted sub-cells are formed on a top surface of sub-cell 5 105 composed of Ge and having a bandgap of about 0.67 eV, which can be formed as part of the substrate. As would be apparent to those of ordinary skill in the art, the parenthetical element noted above may or may not be present in any noticeable quantity in the respective sub-cell.

It is to be understood that FIG. 1 is merely an example of a typical multijunction solar cell and that such solar cells may include any number of sub-cells. Although not shown for simplicity and as would be apparent to those skilled in the art, each sub-cell 105, 110, 115, 120, 125 (and those of FIGS. 2-7 that are discussed below) typically includes a plurality of layers, such as, but not limited to, a front surface field ("FSF") layer, an emitter layer, a depletion region, a base, and a back surface field layer 105. Other suitable sub-cell configurations may be used. The FSF region is the window region that faces the sun after cap etch. Underneath the FSF region is the emitter region of the top p-n junction that forms a diode. Similar junctions are disposed below the top p-n junction, thus forming a multijunction solar cell. The top electrode includes gridlines 135 making contact with the FSF region through cap region 130, wherein the cap region 130 consists of semiconductor material patterned according to the shape of the metallic gridlines (metal contacts) 135. The bottom electrode (not shown) is a metal region at the back surface of the solar cell in contact with the substrate 105. Gridlines 135 and cap region 130 may be covered with a dielectric material, such as an anti-reflection coating (not shown).

Figure 2:
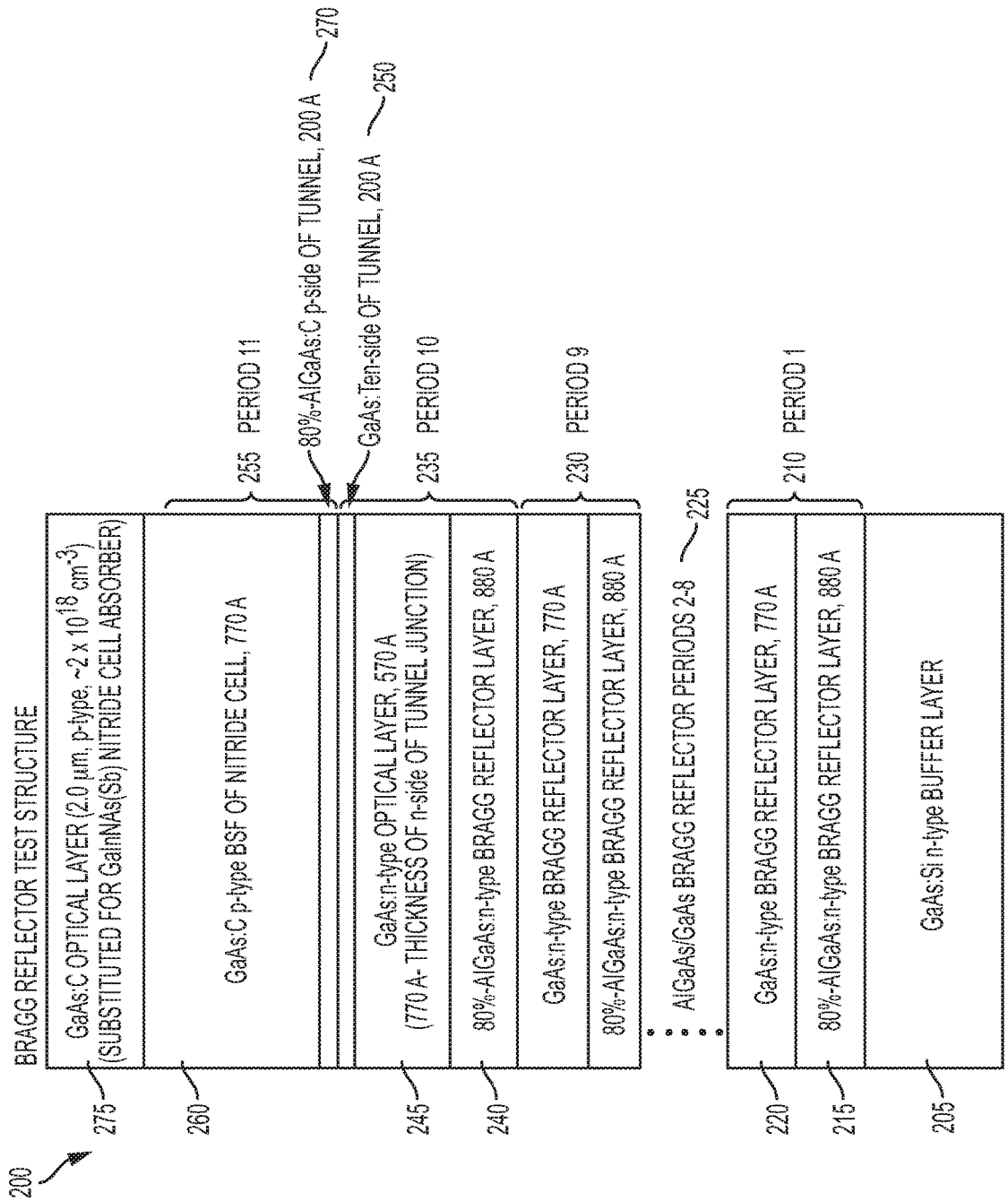
FIG. 2 depicts an example Bragg reflector structure from development of the reflector structure for a dilute nitride GaInNAs solar cell, showing the integration of electrically functional layers such as tunnel junction layers into the optical structure of the multilayer reflector structure, according to examples.

FIG. 2 depicts an example Bragg reflector structure 200 from development of the reflector structure for a dilute nitride GaInNAs solar cell, showing the integration of electrically functional layers such as tunnel junction layers into the optical structure of the multilayer reflector structure, according to examples. The Bragg reflector structure 200 can be used in any of the following aspects discussed below with reference to FIGS. 3-9.

As shown in FIG. 2, the Bragg reflector structure 200 comprises a plurality of repeating and alternating layers having different refractive indexes formed on a buffer layer 205, such as silicon (Si) doped GaAs n-type buffer layer. Although the plurality of repeating and alternating layers is shown having nine periods, the Bragg reflector structure 200 is not limited to by the number of layers. Each of the alternating layers can comprises Group III/V materials that can be doped with one or more n-type dopants selected from the group including: Si, Ge, S, Se, Te and/or one or more p-type dopants selected from the group including: Mg, Zn, Cd, Hg, C. Period 1 210 of the alternating layers can comprise a layer 215 comprising AlGaAs n-type Bragg reflector layer having about 1% to about 100%, or about 20% to about 95%, or about 50% to about 90%, or about 60% to about 85%, or about 80% Al doped with one or more n-type dopants having a thickness of about 880 Å formed on a top surface of the buffer layer 205 and a layer 220 comprising GaAs n-type Bragg reflector layer doped with one or more n-type dopants having a thickness of about 770 Å formed on a top surface of layer 215. Layers 215 and 220 repeat for periods 2-8 225 and period 9 230. Period 10 235 comprises a layer 250 comprising a GaAs n-side of tunnel junction doped with one more n-type dopants having a thickness of about 200 Å, a layer 245 comprising a GaAs n-type optical layer doped with one or more n-type dopants having a thickness of about 570 Å (layers 245 and 250 functioning as a n-side of a tunnel junction and having a combined thickness of about 770 Å) formed over a layer 240 comprising a AlGaAs n-type Bragg reflector layer having about 1% to about 100%, or about 20% to about 95%, or about 50% to about 90%, or about 60% to about 85%, or about 80% Al doped at 80% with one or more n-type dopants having a thickness of about 880 Å. Period 11 comprises a layer 260 comprising a GaAs doped with one or more p-type dopants functioning as a p-type BSF of a nitride cell having a thickness of about 770 Å formed on a a layer 270 comprising a AlGaAs p-side of the tunnel junction having about 1% to about 100%, or about 20% to about 95%, or about 50% to about 90%, or about 60% to about 85%, or about 80% Al doped with one or more p-type dopants, having a thickness of about 200 Å (layer 270 functioning as a p-side of the tunnel junction and having a thickness of about 880 Å). The tunnel junction provides a low electrical resistance and optically low-loss connection between adjacent p-type and n-type layers of the Bragg grating structure without needing rectification or diode functionality that is typically necessary for adjacent p-type/n-type layers. Layer 275 is an p-type optical layer that comprises GaAs doped with one or more p-type dopants, for example, C functioning as an optical layer having a thickness of about 2.0 µm, with the p-type dopants doped at about $10^{20}$ atoms per cm$^3$ or about 0.1% to about 1%, which can be substituted for GaInNAs(sb) nitride cell absorber layer. The AlGaAs can have an aluminum mole fraction of 60% to 90%. The tunnel junction p-type and n-type layers can have a thicknesses between 100 Å and 1000 Å.

As can be seen in FIG. 2, the thickness of each layer of the Bragg reflector structure 200 is approximately equal, with the AlGaAs n-type layer slightly thicker than the GaAs p-type layer. The thickness of the layers within the Bragg reflector structure 200 determine, at least in part, which wavelengths of radiation are reflected. With the arrangement shown in FIG. 2, the Bragg reflector structure 200 is configured to reflect radiation having a wavelength at around 1.2 to 1.3 μm. The present disclosure is not limited with respect to the number of layers, composition of the layers, the thickness of layers, and the amount of doping for each layer.

The following examples that are discussed with regard to FIG. 3-6 are for 5- and 6-junction solar cells. However, as will be apparent, aspects of the present disclosure can be used in single or multiple (up to, for example, 25 junctions) junction solar cells where one or more Bragg grating structures are deposed below the nitride layer to reflect radiation back into the nitride layer, thus allowing the nitride layer to be grown as a thin layer while still having the nitride layer collect more carriers and enhance the current in the nitride layer.

Figure 3:
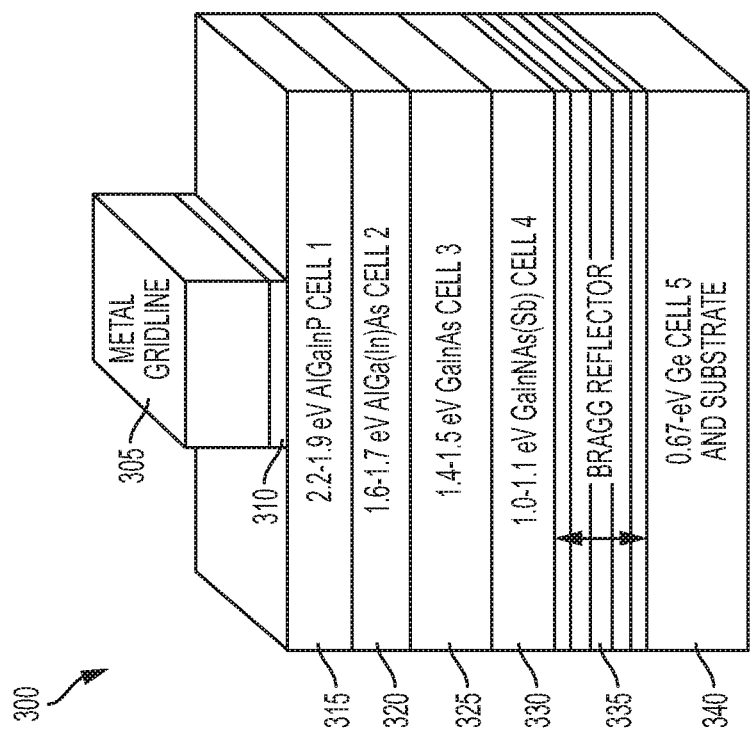
FIG. 3 depicts an example schematic cross section of a 5-junction nitride cell, with a single Bragg reflector (e.g., AlGaAs/GaAs) beneath the nitride cell 4, according to examples.

FIG. 3 depicts an example schematic cross section of a 5-junction nitride solar cell 300, with a single Bragg reflector (e.g., AlGaAs/GaAs) beneath the nitride cell 4, according to examples. Nitride solar cell 300 comprises a metal gridline layer 305 formed on a top surface of capping layer 310. Layer 315 comprises solar cell 1 composed of AlGaInP having a bandgap of about 1.9-2.2 eV formed on a top surface of layer 320, which comprises solar cell 2 composed of AlGa(In)As having a bandgap of about 1.6-1.7 eV. Layer 325 comprises solar cell 3 composed of GaInAs having a bandgap of about 1.4-1.5 eV formed on a top surface of layer 330 (nitride layer), which comprises solar cell 4 composed of GaInNAs(Sb) having a bandgap of about 1.0-1.1 eV. A Bragg reflector 335 is formed below layer 330 (nitride layer). The Bragg reflector 335 can be the Bragg reflector of FIG. 2 or can be another type of Bragg reflector. The Bragg reflector 335 is formed on an epitaxial region of a top surface of layer 340 that comprises solar cell 5, which is composed of Ge, which can function as a substrate to the nitride solar cell 300, and having a bandgap of about 0.67 eV. A metal contact (not shown) can be disposed on a back surface of layer 340.

Figure 4:
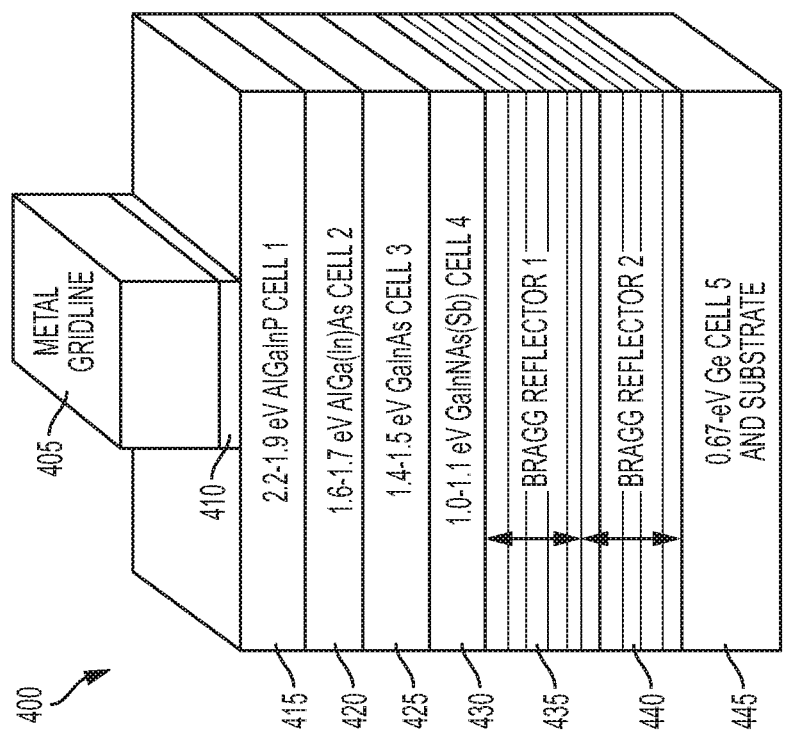
FIG. 4 depicts an example schematic cross section of a 5-junction nitride cell, with a double Bragg reflector (e.g., AlGaAs/GaAs) beneath the nitride cell 4, according to examples.

FIG. 4 depicts an example schematic cross section of a 5-junction nitride solar cell 400, with a double Bragg reflector (e.g., AlGaAs/GaAs) beneath the nitride cell 4, according to examples. Nitride solar cell 400 is similar to the nitride solar cell 300 with the exception that nitride solar cell 400 comprises two Bragg reflector structures formed on top of each other and both formed below the nitride layer. Nitride solar cell 400 comprises a metal gridline layer 405 formed on a top surface of capping layer 410. Layer 415 comprises solar cell 1 composed of AlGaInP having a bandgap of about 1.9-2.2 eV formed on a top surface of layer 420, which comprises solar cell 2 composed of AlGa(In)As having a bandgap of about 1.6-1.7 eV. Layer 425 comprises solar cell 3 composed of GaInAs having a bandgap of about 1.4-1.5 eV formed on a top surface of layer 430 (nitride layer), which comprises solar cell 4 composed of GaInNAs (Sb) having a bandgap of about 1.0-1.1 eV. A first Bragg reflector 435 is formed below layer 430 (nitride layer). A second Bragg reflector 440 is formed below the first Bragg reflector 435. The first and/or the second Bragg reflector 435, 440 can be the Bragg reflector of FIG. 2 or can be another type of Bragg reflector. The second Bragg reflector 440 is formed on an epitaxial region of a top surface of layer 445 that comprises solar cell 5, which is composed of Ge, which can function as a substrate to the nitride solar cell 400, and having a bandgap of about 0.67 eV. A metal contact (not shown) can be disposed on a back surface of layer 445. In additional examples, more than two Bragg reflectors may be incorporated beneath the nitride solar cell or other weak-current-producing cell layer.

Figure 5:
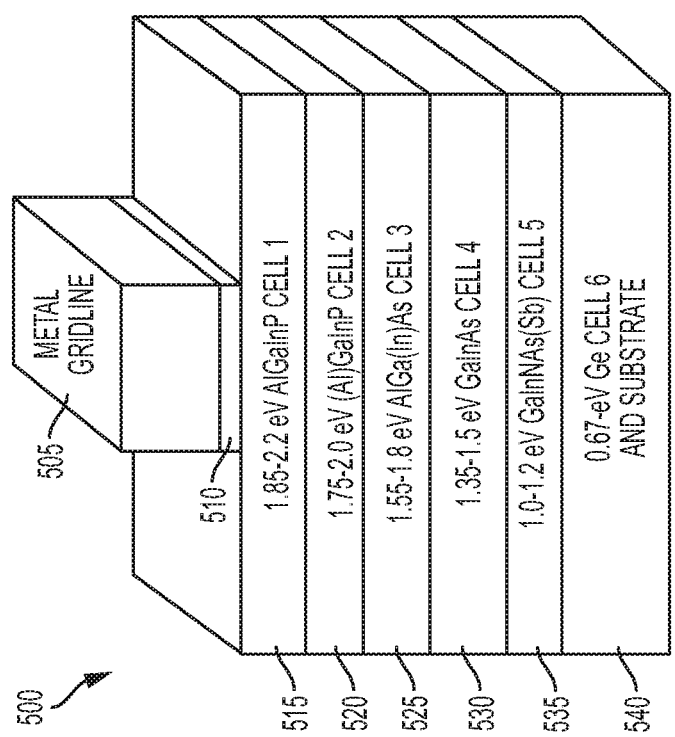
FIG. 5 depicts an example schematic cross section of a conventional 6-junction nitride cell (having a dilute nitride GaInNAs(Sb) subcell), with no Bragg reflector beneath the nitride cell 5.

FIG. 5 depicts an example schematic cross section of a prior art 6-junction nitride solar cell (having a dilute nitride GaInNAs(Sb) subcell), with no Bragg reflector beneath the nitride cell 5. Nitride solar cell 500 is similar to the nitride solar cell 100 with the exception that nitride solar cell 500 is a 6-junction nitride solar cell whereas nitride solar cell 1 is a 5-junction nitride solar cell. Nitride solar cell 500 comprises a metal gridline layer 505 formed on a top surface of capping layer 510. Layer 515 comprises solar cell 1 composed of AlGaInP having a bandgap of about 1.85-2.2 eV formed on a top surface of layer 520, which comprises solar cell 2 composed of (Al)GaInP having a bandgap of about 1.75-2.0 eV. Layer 525 comprises solar cell 3 composed of AlGa(In)As having a bandgap of about 1.55-1.8 eV formed on a top surface of layer 530, which comprises solar cell 4 composed of GaInAs having a bandgap of about 1.35-1.15 eV. Layer 535 (nitride layer) is formed below layer 530 and comprises solar cell 5 composed of GaInNAs (Sb) having a bandgap of about 1.0-1.2 eV. Layer 540 comprises solar cell 6, which is composed of Ge, which can function as a substrate to the nitride solar cell 500, and having a bandgap of about 0.67 eV. A metal contact (not shown) can be disposed on a back surface of layer 540.

Figure 6:
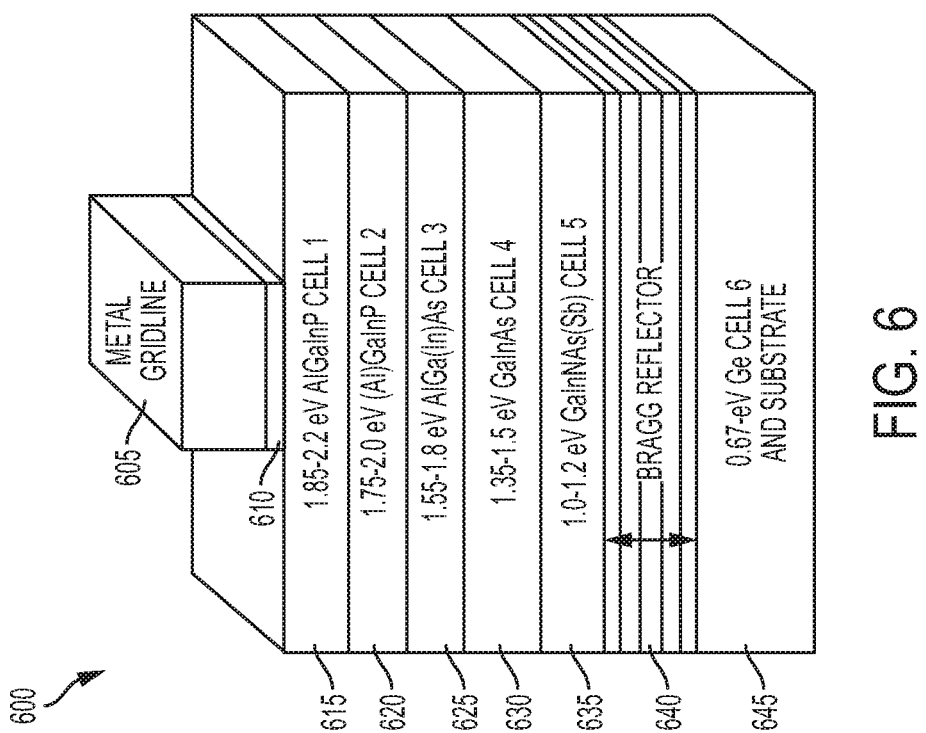
FIG. 6 depicts an example schematic cross section of a 6-junction nitride cell, with a single Bragg reflector (e.g., AlGaAs/GaAs) beneath the nitride cell 5, according to examples.

FIG. 6 depicts an example schematic cross section of a 6-junction nitride cell, with a single Bragg reflector (e.g., AlGaAs/GaAs) beneath the nitride cell 5, according to examples. Nitride solar cell 600 comprises a metal gridline layer 605 formed on a top surface of capping layer 610. Layer 615 comprises solar cell 1 composed of AlGaInP having a bandgap of about 1.85-2.2 eV formed on a top surface of layer 620, which comprises solar cell 2 composed of (Al)GaInP having a bandgap of about 1.75-2.0 eV. Layer 625 comprises solar cell 3 composed of AlGa(In)As having a bandgap of about 1.55-1.8 eV formed on a top surface of layer 630, which comprises solar cell 4 composed of GaInAs having a bandgap of about 1.35-1.15 eV. Layer 635 (nitride layer) is formed below layer 630 and comprises solar cell 5 composed of GaInNAs(Sb) having a bandgap of about 1.0-1.2 eV. A Bragg reflector 640 is formed below layer 635 (nitride layer). The Bragg reflector 640 can be the Bragg reflector of FIG. 2 or can be another type of Bragg reflector. The Bragg reflector 640 is formed on an epitaxial region of a top surface of layer 645 comprises solar cell 6, which is composed of Ge, which can function as a substrate to the nitride solar cell 600, and having a bandgap of about 0.67 eV. A metal contact (not shown) can be disposed on a back surface of layer 645.

Figure 7:
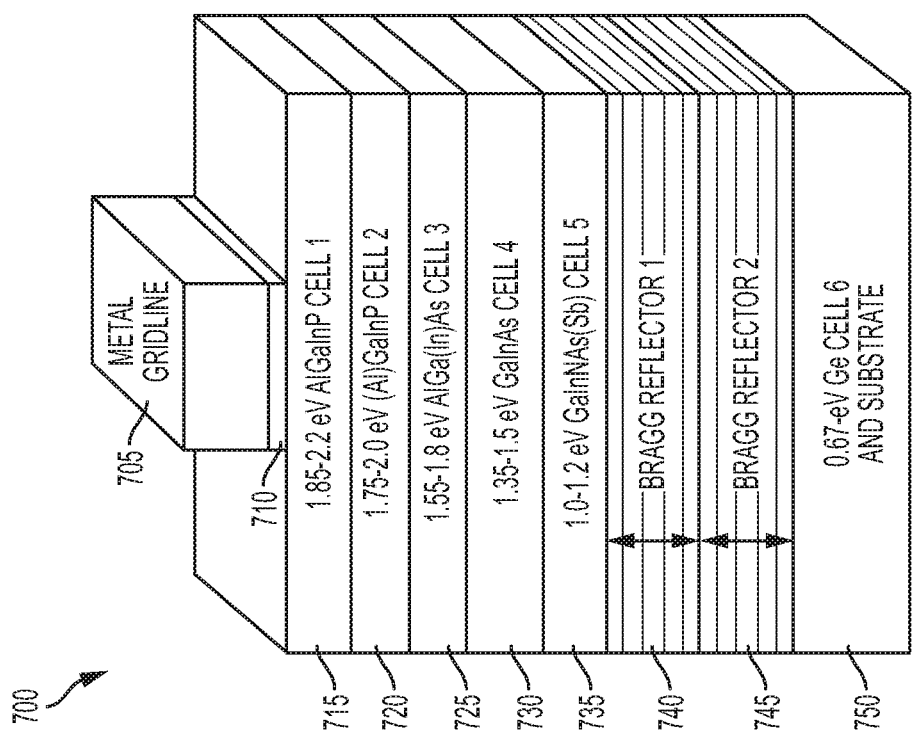
FIG. 7 depicts an example schematic cross section of a 6-junction nitride cell, with a double Bragg reflector (e.g., AlGaAs/GaAs) beneath the nitride cell 5, according to examples.

FIG. 7 depicts an example schematic cross section of a 6-junction nitride cell, with a double Bragg reflector (e.g., AlGaAs/GaAs) beneath the nitride cell 5, according to examples. Nitride solar cell 700 is similar to the nitride solar cell 600 with the exception that nitride solar cell 700 comprises two Bragg reflector structures formed on top of each other and both formed below the nitride layer. Nitride solar cell 700 comprises a metal gridline layer 705 formed on a top surface of capping layer 710. Layer 715 comprises solar cell 1 composed of AlGaInP having a bandgap of about 1.85-2.2 eV formed on a top surface of layer 720, which comprises solar cell 2 composed of (Al)GaInP having a bandgap of about 1.75-2.0 eV. Layer 725 comprises solar cell 3 composed of AlGa(In)As having a bandgap of about 1.55-1.8 eV formed on a top surface of layer 730, which comprises solar cell 4 composed of GaInAs having a bandgap of about 1.35-1.15eV. Layer 735 (nitride layer) is formed below layer 730 and comprises solar cell 5 composed of GaInNAs(Sb) having a bandgap of about 1.0-1.2 eV. A first Bragg reflector 740 is formed below layer 735 (nitride layer). A second Bragg reflector 745 is formed below the first Bragg reflector 740. The first and/or the second Bragg reflector 740, 745 can be the Bragg reflector of FIG. 2 or can be another type of Bragg reflector. The second Bragg reflector 745 is formed on a top surface of layer 750 comprises solar cell 6, which is composed of Ge, which can function as a substrate to the nitride solar cell 700, and having a bandgap of about 0.67 eV. A metal contact (not shown) can be disposed on a back surface of layer 750.

Figure 8:
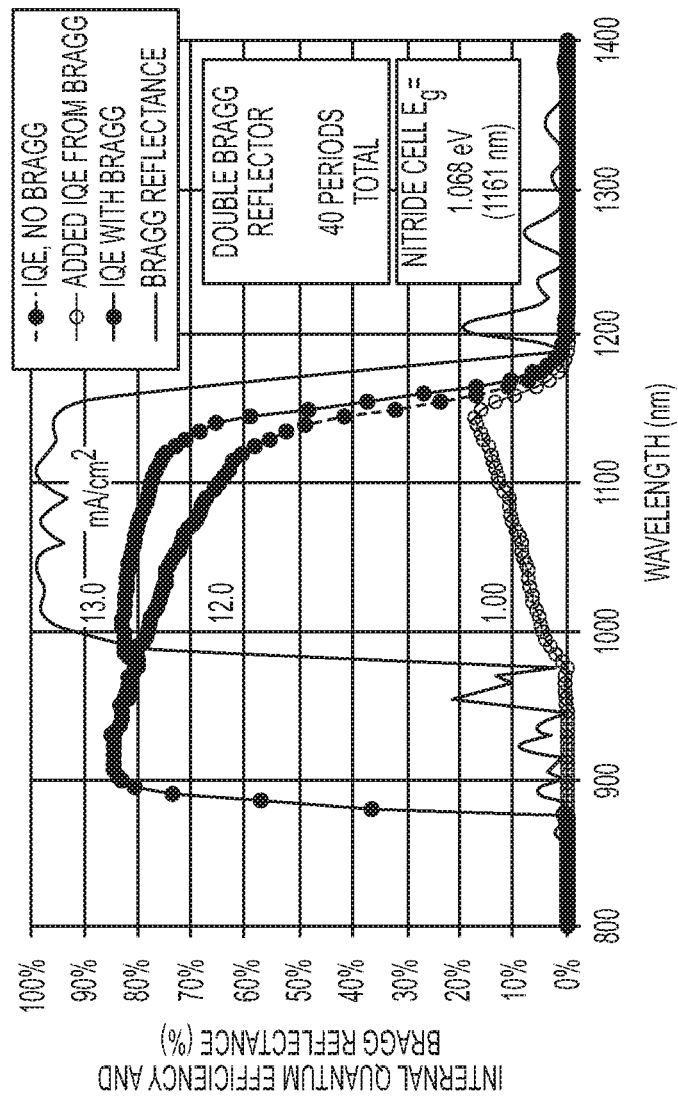
FIG. 8 depicts the modeled effect of double Bragg reflector on internal quantum efficiency of a dilute nitride GaInNAs solar cell with bandgap Eg of 1.068 eV, according to examples. The current increases from 12 to 13 mA/cm2, a very significant increase allowing the GaInNAs cell to be used effectively in a 5-junction (5J) cell without limiting the current of the other subcells in the stack.

FIG. 8 depicts the modeled effect of double Bragg reflector on internal quantum efficiency of a dilute nitride GaInNAs solar cell with bandgap of 1.068 eV, according to examples. As can been seen in FIG. 8, the current increases from 12 to 13 mA/cm2, which is a very significant increase allowing the GaInNAs cell to be used effectively in a 5-junction (5J) cell without limiting the current of the other subcells in the stack.

Figure 9:
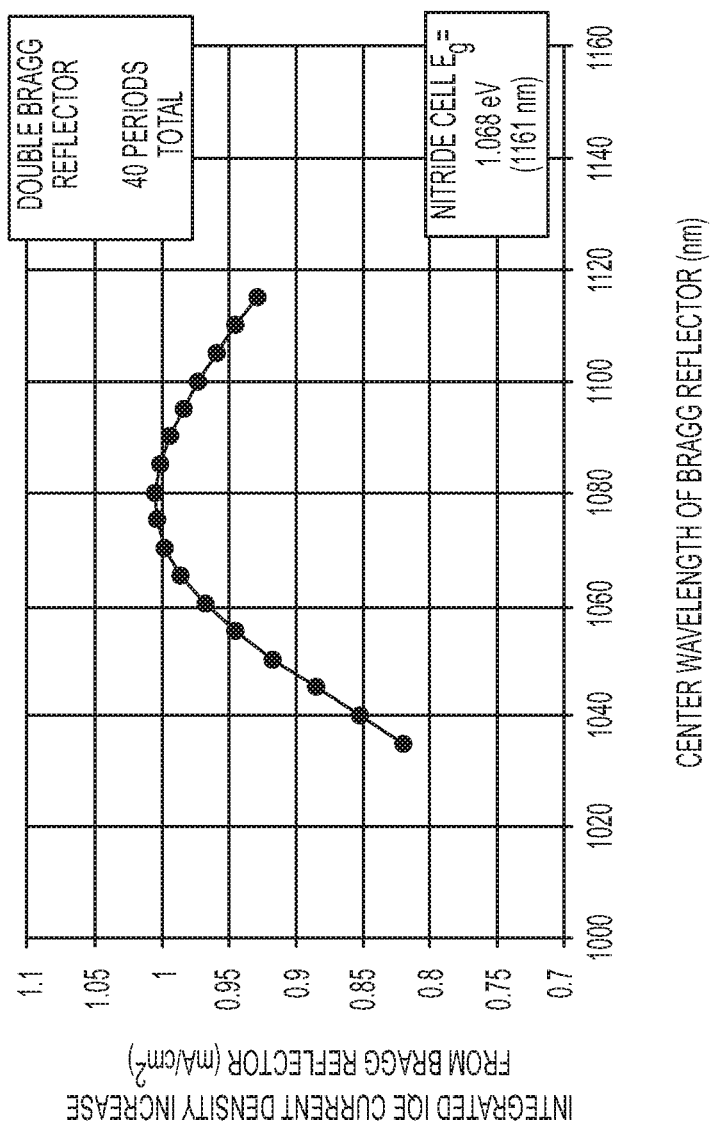
FIG. 9 depicts an example optimization of the center wavelength of a double Bragg reflector in order to maximize current density of a dilute nitride GaInNAs cell, according to examples.

FIG. 9 depicts an example optimization of the center wavelength of a double Bragg reflector in order to maximize current density of a dilute nitride GaInNAs cell, according to examples. As can be seen in FIG. 9, the center wavelength of the Bragg reflector with 40 periods total peaks in terms of current density at about 1080 nm.

Figure 10A:
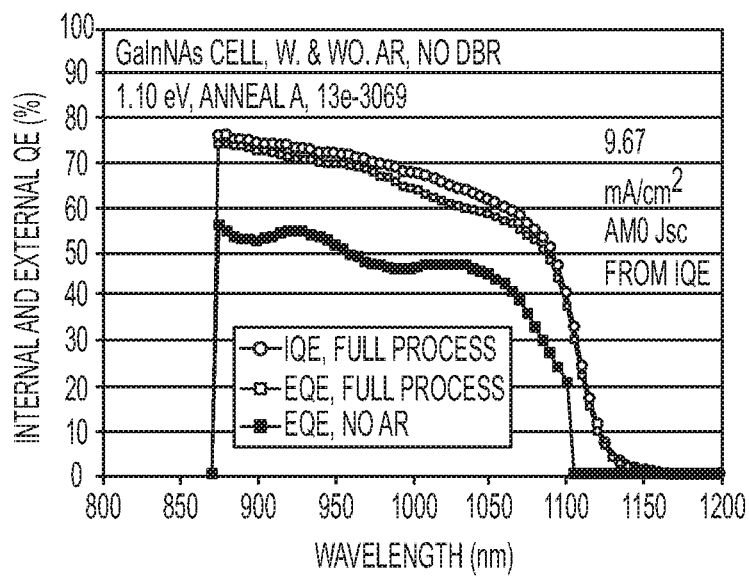
FIG. 10 depicts the measured external and internal quantum efficiency, and reflectance, of a 1-junction dilute nitride GaInNAs cell (FIG. 10A) without a distributed Bragg reflector (DBR) beneath the nitride cell, and (FIG. 10B) with a DBR beneath the nitride cell, according to examples. The enhancement in photoresponse and current density for case (FIG. 10B) with the Bragg reflector is clear.
Figure 10B:
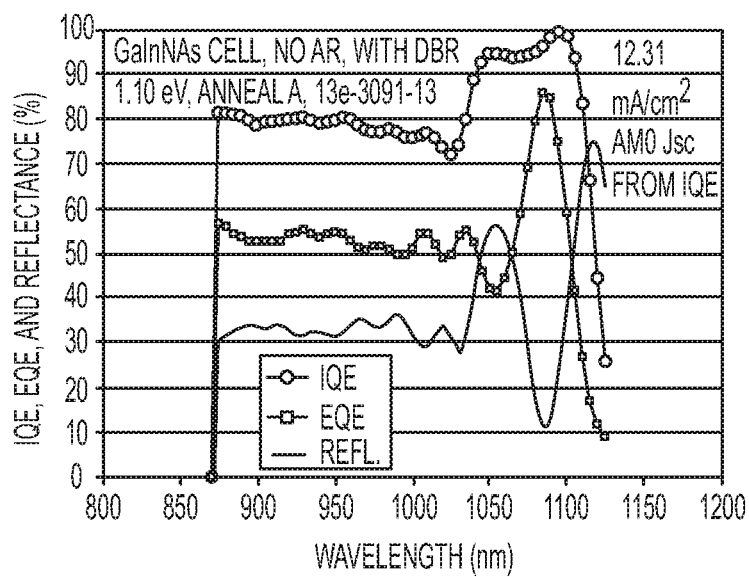

FIG. 10 depicts the measured external and internal quantum efficiency, and reflectance, of a 1-junction dilute nitride GaInNAs cell (FIG. 10A) without a distributed Bragg reflector (DBR) beneath the nitride cell, and (FIG. 10B) with a DBR beneath the nitride cell, according to examples. The enhancement in photoresponse and current density for case (FIG. 10B) with the Bragg reflector is clear.

Figure 11:
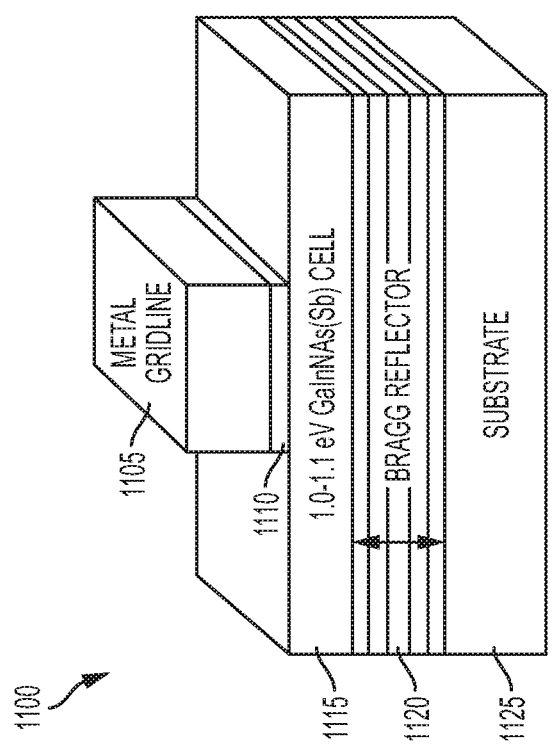
FIG. 11 depicts an example schematic cross section of a single junction nitride solar cell, with a single Bragg reflector (e.g., AlGaAs/GaAs) beneath the nitride solar cell, according to examples.

FIG. 11 depicts an example schematic cross section of a single junction nitride solar cell 1100, with a single Bragg reflector (e.g., AlGaAs/GaAs) beneath the nitride solar cell, according to examples. Nitride solar cell 1100 comprises a metal gridline layer 1105 formed on a top surface of capping layer 1110. Layer 1115 (nitride layer), which comprises a solar cell composed of GaInNAs(Sb) having a bandgap of about 1.0-1.1 eV. A Bragg reflector 1120 is formed below layer 1115 (nitride layer). The Bragg reflector 1120 can be the Bragg reflector of FIG. 2 or can be another type of Bragg reflector. A second Bragg (not shown) reflector can be disposed below Bragg reflector 1120, such as described in FIG. 4. The Bragg reflector 1120 is formed on an epitaxial region of a top surface of substrate layer 1125. A metal contact (not shown) can be disposed on a back surface of layer 1125.

Many types of solar cells have a photogeneration layer that is weakly absorbing or that produces low current due to material or device constraints. It is desirable to increase the photogeneration of charge carriers in these layers to increase solar cell current. When the solar cell is a subcell in a multijunction solar cell, inadequate photogeneration and current can limit the current in all the other subcells, with strongly detrimental effects on the entire multijunction cell performance. Examples include the following.

1. Solar cells, including multijunction solar cells, with one or more dilute nitride GaInNAs or GaInNAsSb cells, in which the region of effective carrier collection is thin, due to low minority carrier lifetime.

2. Solar cells, including multijunction solar cells, with one or more cells that are subject to radiation damage, in which the cell absorber (usually the base) is made thin in order to reduce the detrimental effects of radiation.

3. Solar cells, including multijunction solar cells, with one or more metamorphic, or relaxed, lattice-mismatched, subcells, in which the metamorphic solar cell absorber is grown with a smaller lattice constant and higher bandgap, or is grown thinner, to reduce the detrimental effects of lattice mismatch.

4. Solar cells, including multijunction solar cells, with one or more pseudomorphic, or strained, lattice-mismatched, photogeneration layers in the cells, such as energy wells that are strained with respect to the adjacent layers, that are grown thin to avoid crystal relaxation, and/or to keep the photogeneration layers in the space-charge region of the solar cell where the current collection probability is high.

In some examples of the present teachings, one or more weak-current-producing solar cells have one or more of the following structures integrated into the cell, increase photogeneration and current of the cell:

A metal reflector positioned beneath the cell, or metal reflector combined with a transparent medium such as a compliant polymer, oxide, or nitride layer, where the cell is the bottommost subcell in a multijunction cell stack.

A transparent medium such as a compliant polymer, oxide, or nitride layer positioned beneath the cell, which reflects light back into the cell by virtue of the refractive index contrast between the cell material and the transparent medium, where the cell is not the bottommost subcell in a multijunction cell stack, such that the cell has other active subcells beneath the cell and beneath the reflector composed of a transparent medium, and such that light with some wavelengths and incident angles can be transmitted through the reflector structure to be used by the lower subcells.

A light scattering structure positioned above or beneath the cell, such as the following. A transparent medium with particles imbedded in it with a different refractive index than the transparent medium, where the imbedded particles may be transparent insulators, transparent conductors, or highly reflective metal particles. A surface roughened by cross-hatching, 3-dimensional growth, or other self-assembly method during semiconductor growth. A surface that is intentionally patterned by semiconductor processing methods before growth, after growth, or in between semiconductor growth steps, such that light is deflected by the light scattering structures at a non-zero angle with respect to the angle of incident light, increasing the path length of light through the current producing layers of the solar cell, and/or increasing the amount of total internal reflection within the cell.

Low-refractive-index and high-refractive-index semiconductor layers in the cell structure—such as tunnel junction layers, back-surface field layers, window layers, buffer layers, contact layers, etc.—may be designed to be part of the optical reflector structure by adjusting their thickness and/or composition and/or refractive index, such that the layers have both an electrical and optical function, and serve a have a double purpose.

Side fringes (small reflectance peaks above and below the main reflectance range of the Bragg reflector) may be suppressed by using one or more additional layers above and below the Bragg reflector with reduced thickness, e.g., 0.3× to 0.7× thickness, relative to the majority of layers in the main part of the Bragg reflector. These extra thin layers for satellite peak suppression may be composed of electrically active cell layers that serve a dual electrical/optical function in the cell, and may have the same composition or different composition than the majority of layers in the repeating high/low refractive index pairs (main part) of the Bragg reflector.

Examples of the weak-current-producing photovoltaic cells include the following.

1. dilute nitride GaInNAs or GaInNAsSb cells, in which the region of effective carrier collection is thin, due to low minority carrier lifetime.

2. cells that are subject to radiation damage, in which the cell absorber (usually the base) is made thin in order to reduce the detrimental effects of radiation.

3. metamorphic, or lattice-mismatched, cells, in which the metamorphic solar cell absorber is grown with a smaller lattice constant and higher bandgap, or is grown thinner, to reduce the detrimental effects of lattice mismatch.

4. cells with one or more pseudomorphic, or strained, lattice-mismatched, photogeneration layers in the cells, such as energy wells that are strained with respect to the adjacent layers, that are grown thin to avoid crystal relaxation, and/or to keep the photogeneration layers in the space-charge region of the solar cell where the current collection probability is high.

The weak-current-producing cells may be single-junction cells, or may be subcells within a multijunction solar cell structure.

In another example, two or more dilute nitride solar cells or other cells with weak current producing layers are positioned in optical series, thus increasing the optical path length through the weak current producing layers (such as the thin, weakly absorbing space-charge region of a dilute nitride solar cell), but with the cells connected electrically in parallel, to increase the current production of the parallel combination of two or more subcells. The higher current of the parallel combination may be used to current match other subcells in a series-interconnected multijunction solar cell stack. The combination of two or more dilute nitride or other weak current producing subcells may have substantially the same composition and bandgap as each other (0.0-0.1 eV difference in bandgap), moderately different bandgaps with respect to each other (0.1-0.3 eV difference in bandgap), or a relatively substantial difference in bandgap with respect to each other (greater than 0.3 eV difference in bandgap).

Those skilled in the art will be able to make various modifications to the described examples without departing from the true spirit and scope. The terms and descriptions used herein are set forth by way of illustration only and are not meant as limitations. In particular, although the method has been described by examples, the steps of the method can be performed in a different order than illustrated or simultaneously. Those skilled in the art will recognize that these and other variations are possible within the spirit and scope as defined in the following claims and their equivalents.

What is claimed is:

1. A solar cell device comprising:
a substrate comprising a front side surface and a backside surface;
an epitaxial region overlying the substrate, wherein the epitaxial region comprises a first Bragg reflector disposed below a first solar cell and a second Bragg reflector disposed below the first Bragg reflector, wherein the first solar cell comprises a dilute nitride composition and has a first bandgap, wherein the first Bragg reflector is operable to reflect a first range of radiation wavelengths back into the first solar cell and the second Bragg reflector is operable to reflect a third range of wavelengths back into the first solar cell, and the first Bragg reflector and the second Bragg reflector are operable to cool the solar cell device by reflecting a second range of radiation wavelengths that are outside the photogeneration wavelength range of the first solar cell or that are less than 50% absorbed by the first solar cell;
a capping layer disposed above the top surface of the first solar cell;
a first metal contact disposed below the backside surface; and
a second metal contact disposed above the top surface of the capping layer.

2. The solar cell device of claim 1, wherein the first solar cell comprises GaInNAs or GaInNAsSb.

3. The solar cell device of claim 1, further comprising a second solar cell disposed above the top surface of the first solar cell, wherein the second solar cell has a bandgap that is higher than the bandgap of the first solar cell.

4. The solar cell device of claim 1, wherein the first Bragg reflector comprises a tunnel junction formed between a p-type layer and an n-type layer of the first Bragg reflector.

5. The solar cell device of claim 4, wherein the tunnel junction comprises a carbon doped AlGaAs p-side layer and a tellurium doped GaAs n-type layer.

6. The solar cell device of claim 5, wherein the AlGaAs has an aluminum mole fraction of 60% to 90%.

7. The solar cell device of claim 4, wherein the tunnel junction p-type and n-type layers have thicknesses between 100 Å and 1000 Å.

8. The solar cell device of claim 1, wherein the first Bragg reflector comprises a layer composed of a material that has been doped by two or more n-type dopants.

9. The solar cell device of claim 8, wherein the two different n-type dopants comprise tellurium and silicon.

10. The solar cell device of claim 1, wherein the first Bragg reflector comprises a back-surface field (BSF) layer of an adjacent solar cell.

11. The solar cell device of claim 1, wherein the first Bragg reflector comprises an emitter layer, a window layer, or a front-surface-field (FSF) layer of an adjacent solar cell.

12. A solar cell device comprising:
a substrate;
a first solar cell; and
an epitaxial region overlying the substrate, wherein the epitaxial region comprises a first Bragg reflector disposed below a first solar cell and a second Bragg reflector disposed below the first Bragg reflector, wherein the first solar cell comprises a dilute nitride composition and has a first bandgap, wherein the first Bragg reflector is operable to reflect a first range of radiation wavelengths back into the first solar cell and the second Bragg reflector is operable to reflect a third range of wavelengths back into the first solar cell, and the first Bragg reflector and the second Bragg reflector are operable to cool the solar cell device by reflecting a second range of radiation wavelengths that are outside the photogeneration wavelength range of the first solar cell or that are less than 50% absorbed by the first solar cell;
wherein the first Bragg reflector and the second Bragg reflector comprise one or more solar cell structures of an adjacent solar cell, chosen from a list including:

a p-type tunnel junction layer;
an n-type tunnel junction layer;
a back-surface field (BSF) layer;
an emitter layer;
a window layer;
a front-surface-field (FSF) layer; or
an electrical contact layer.

13. The solar cell device of claim 12, wherein the first solar cell comprises GaInNAs or GaInNAsSb.

14. The solar cell device of claim 12, further comprising a second solar cell disposed above the top surface of the first solar cell, wherein the second solar cell has a bandgap that is higher than the bandgap of the first solar cell.

15. The solar cell device of claim 12, wherein the first Bragg reflector comprises a tunnel junction formed between a p-type layer and an n-type layer of the first Bragg reflector.

16. The solar cell device of claim 15, wherein the tunnel junction comprises a carbon doped AlGaAs p-side layer and a tellurium doped GaAs n-type layer.

17. The solar cell device of claim 16, wherein the AlGaAs has an aluminum mole fraction of 60% to 90%.

18. The solar cell device of claim 15, wherein the tunnel junction p-type and n-type layers have thicknesses between 100 Å and 1000 Å.

19. The solar cell device of claim 12, wherein the first Bragg reflector comprises a layer composed of a material that has been doped by two or more n-type dopants.

20. The solar cell device of claim 19, wherein the two different n-type dopants comprise tellurium and silicon.

* * * * *